United States Patent [19]
Salter, III

[11] Patent Number: 5,359,555
[45] Date of Patent: Oct. 25, 1994

[54] COLUMN SELECTOR CIRCUIT FOR SHARED COLUMN CMOS EPROM

[75] Inventor: Robert M. Salter, III, Saratoga, Calif.

[73] Assignee: National Semiconductor Corporation, Santa Clara, Calif.

[21] Appl. No.: 847,114

[22] Filed: Mar. 6, 1992

[51] Int. Cl.$^5$ .............................................. G11C 11/34
[52] U.S. Cl. ..................... 365/185; 365/203; 365/218; 365/230.06; 365/900
[58] Field of Search ............... 365/185, 218, 203, 900, 365/230.06

[56] References Cited

U.S. PATENT DOCUMENTS 5,027,321  6/1991  Park .................................... 365/185

Primary Examiner—Joseph E. Clawson, Jr.
Attorney, Agent, or Firm—Townsend and Townsend Khourie and Crew

[57] ABSTRACT

A CMOS memory is disclosed which employs a column selector circuit that prevents write disturb in shared column EPROMs. When a selected memory transistor is programmed, disturb is prevented by selecting all columns on the source side of the selected memory transistor to be tied to the source programming voltage, and selecting all columns on the drain side of the selected memory transistor to be tied to the drain programming voltage. By reducing voltage differentials across non-selected memory transistors, write disturb is prevented. This may be implemented by employing shorting devices between all adjacent columns. When a memory transistor is selected, all the shorting devices except the one between the source and drain columns of the selected memory cell are enabled. This may be further improved to minimize the number of required select lines by employing a shorting device comprising transistors controlled by the normal select lines.

4 Claims, 9 Drawing Sheets

COLUMN SELECTOR CIRCUIT FOR SHARED COLUMN CMOS EPROM

BACKGROUND OF THE INVENTION

The present invention relates to semiconductor computer memories. In particular it relates to erasable programmable read only memories (EPROMs).

EPROMs are now well known semiconductor devices, often formed using MOS technology. A MOS EPROM cell is shown in FIG. 1 with word line 14 coupled to bit line 16 by a MOS transistor 34. Bit line 16 serves as a drain for transistor 34, and line 17 serves as a source. Transistor 34 includes a floating gate 35, electrically isolated from the control gate 37. The transistor is programmed by electrons flowing onto the floating gate and being trapped there. This causes the floating gate to act as a capacitor holding charge, thereby altering the functionality of the transistor in a detectable manner, e.g. changing its threshold voltage. In one type of cell, the programming is done by bringing both the word and bit lines high.

The MOS memory cell of FIG. 1 operates at TTL voltage levels or in the general vicinity, but has the advantage of being erasable. It can be erased, for example, by removing the charge from the floating gate using ultraviolet light or electrical techniques. Thus, a cell can be programmed and verified, then erased and reprogrammed if necessary. The capability of reprogramming eliminates the need for test cells as in bipolar PROM circuits.

A typical MOS EPROM circuit is shown in FIG. 2A. As shown, the circuit uses an array 43 of the cells of FIG. 1 with an input pin 36, input buffer 38 and decode circuit 40 for each word line 41. Each memory cell 42 is also connected to a sense line 47, which is coupled to a sense circuit 44, output buffer 46 and output node 48. To program a memory cell 42 of FIG. 2A, a program voltage is provided on a Vpp node 39 to address decode circuit 40 to the selected word line 41. Vpp node 39 not only supplies the high voltage needed for programming, but also selects the programming mode when asserted by enabling programming circuit 45. For most EPROMs Vpp is about 2.5 times the read voltage, which is generally around 5 volts but may be smaller.

Any cell connected to a high word line and a sense line at a high value will be programmed. An input provided through output node 48 and programming circuit 45 causes sense line 47 to carry a high value. Thus, this circuit requires a programming circuit coupled to the output pin, just as the bipolar PROM requires a programming circuit. However, the separate high current data input circuitry coupled to the output (or combined circuitry with high current capability) is eliminated. During a read operation, read voltage levels are used to select the word line through input buffer 38 and decode circuit 40 with the bit lines being sensed through sense circuit 44 and output buffer 46.

EPROM transistor arrays are typically arranged in one of two types of configurations. The older, more prevalent type is the "T" cell, shown in FIG. 2B. Each transistor 34' in this arrangement has a unique drain column, or bit line, 16' and word line 14' combination. The sources 17 are usually attached to a common node throughout the array.

On the other hand, in the shared column or virtual ground array configuration shown in FIG. 2C, pairs of transistors along word line 14" share coincident drain column 16" connections and adjacent pairs share coincident source column 17" connections. This configuration therefore requires selection of word, drain and source to uniquely select an EPROM transistor. Although the shared column approach usually produces a denser array, the read and programming accesses are more difficult since unselected transistors adjacent to the selected one are easier to inadvertently sense or disturb.

A standard method for programming a shared column EPROM is to force the $V_{ss}$ source voltage and $V_{pd}$ drain programming voltage on the respective selected source and drain columns. All other columns are allowed to float. At the same time, the $V_{pp}$ gate programming voltage is applied to the $XS_i$ row select line. FIG. 3 shows a group of EPROM memory cells used to explain the programming process and certain problems with its column selection process. If transistor memory cell 25 is to be programmed, the source and drain columns are selected by asserting $YSS_1$ and $YSD_1$, which turns on the transistors coupled to lines 11 and 13, connecting them to drain line $D_k$ 50 at $V_{pd}$ and source line $S_k$ 60 at $V_{ss}$, respectively. All other transistors and, more importantly, column RMOS III lines float. Unfortunately, this process can lead to errors in adjacent cells, through an effect known as disturb. This problem may occur when a transistor 25, which is desired to be programmed, is adjacent to a transistor 27 which is in an unprogrammed state and is intended to stay that way. As transistor 25 is programmed, the source column 9 of adjacent memory transistor 27 may be floating at voltage $V_{ss}$. With line 11 carrying the programming voltage $V_{pd}$, there will be a voltage drop across transistor 27. Because word select line $XS_i$ selects all the gates on the entire row, transistor 27 will conduct current. The parasitic capacitance $C_{col}$ of source column 9 will require a finite time to rise to $V_{pd}$, during which current will conduct through transistor 27. The current may be at a high enough level to inject hot electrons into the floating gate of memory transistor 27; from this the floating gate would charge to a negative voltage. Although a single such event is probably insufficient to change its data value, repeated cycles can place sufficient charge on the floating gate of transistor 27 to corrupt its data value. This is a significant disadvantage of prior art EPROMs.

SUMMARY OF THE INVENTION

A primary aspect of this invention is directed to a column selector circuit for CMOS memory that prevents write disturb in shared column EPROMs. When a selected memory transistor is programmed, disturb is prevented by selecting all columns on the source side of the selected memory transistor to be tied to the source programming voltage, and selecting all columns on the drain side of the selected memory transistor to be tied to the drain programming voltage. By reducing voltage differentials across non-selected memory transistors, write disturb is prevented. This first aspect is implemented in one embodiment by having each column selectably connectable to both the source and drain lines. A different line of embodiments implement this aspect by employing shorting devices between all adjacent columns. When a memory transistor is selected, all the shorting devices except the one between the source and drain columns of the selected memory cell are enabled.

A secondary aspect of the invention is directed to minimizing the number of column select lines (and therefore the chip area) that are needed to effect the first aspect of the invention. A column selector circuit that combines both aspects of the invention employs a shorting device comprising transistors controlled by the normal column select lines. The preferred embodiment employs such a shorting device using PMOS transistors, and to avoid interfering with read operations, the shorting device is also controlled by the program signal.

DESCRIPTION OF SPECIFIC EMBODIMENTS

Figure 4:
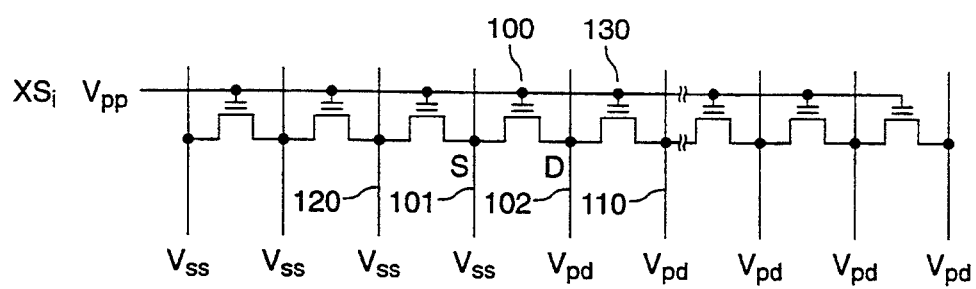
FIG. 4 is an illustration of a biasing scheme that avoids the disturb problem of the circuit of FIG. 3.

To avoid disturb during write operations, a column selector circuit may employ the biasing scheme shown in FIG. 4. In this diagram, assume memory transistor 100 is to be programmed. Column 101 is the source column for this transistor, and column 102 is the drain column for this transistor. Column 110 and the other column lines to the drain side of transistor 100 are held at $V_{pd}$, while column 120 and the other column lines to the source side of transistor 100 are held at $V_{ss}$. Because of the biasing scheme employed here, the only memory transistor with a voltage differential from drain to source is the selected transistor 100. Because none of the other transistors have voltage differentials, essentially no current flows through them.

Only a minuscule amount of current might flow through a different memory transistor, based on slight variations in $V_{ss}$ and $V_{pd}$. For example, assume that just before the columns were selected, line 102 floated near $V_{pd}$ and line 110 floated near $V_{ss}$. Then the parasitic capacitance of the lines might allow some infinitesimal current flow through memory transistor 130 before $V_{pd}$ were asserted at the top of line 110, but this would not be enough current to inject hot electrons on the floating gate of transistor 130.

Figure 5:
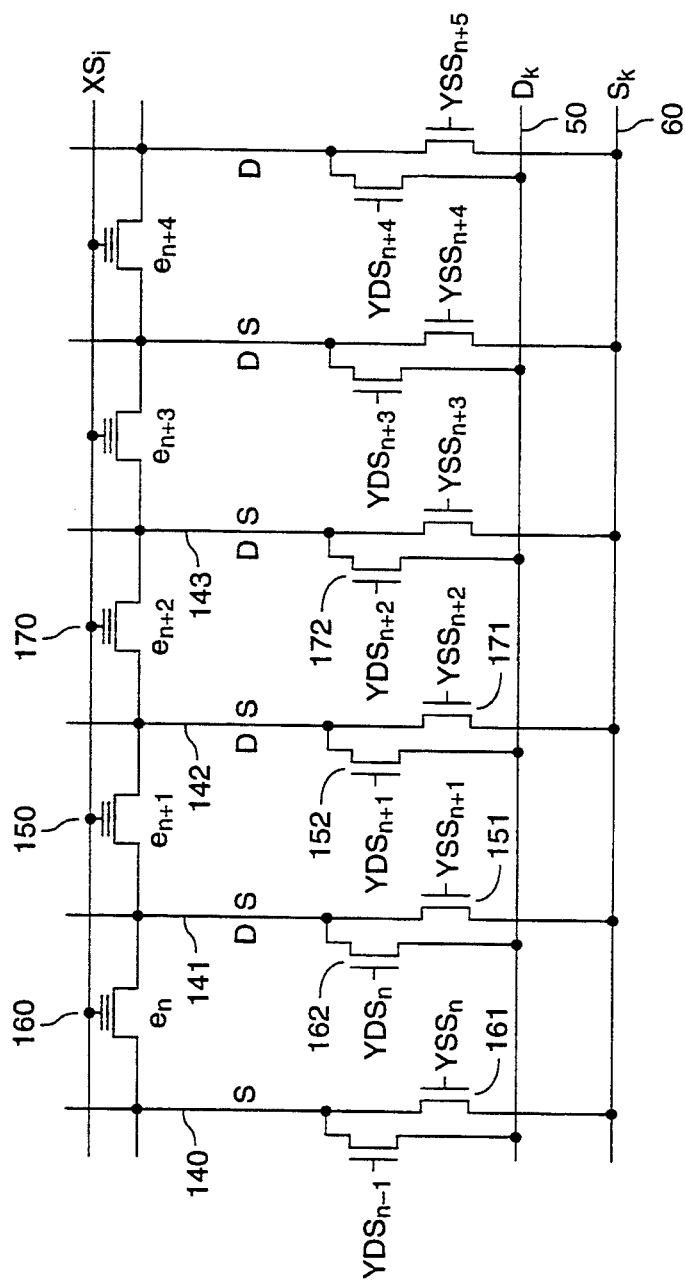
FIG. 5 illustrates a first particular embodiment implementing the biasing scheme of FIG. 4.

A circuit implementing the biasing scheme of FIG. 4 is shown in FIG. 5. Each of columns 140, 141, 142, 143, etc. can be selectively coupled to either drain line 50 or source line 60. If, for example, memory transistor 150 is to be programmed, its source column, column 141, is tied to source $S_k$ line 60 through transistor 151, and its drain column, column 142, is tied to drain $D_k$ line 50 through transistor 152. Column 140 would be connected through source coupling transistor 161 to $S_k$, as would all other columns to the source side of memory transistor 150. Similarly, column 143 would be connected through drain coupling transistor 172 to $D_k$, as would all other columns to the drain side of memory transistor 150. Transistor 162 and the other drain coupling transistors to the source side of transistor 150 would remain off, as would transistor 171 and the other source coupling transistors to its drain side. In this manner, the biasing scheme of FIG. 4 is employed by the circuit of FIG. 5 whenever a memory transistor is selected for programming.

Figure 6:
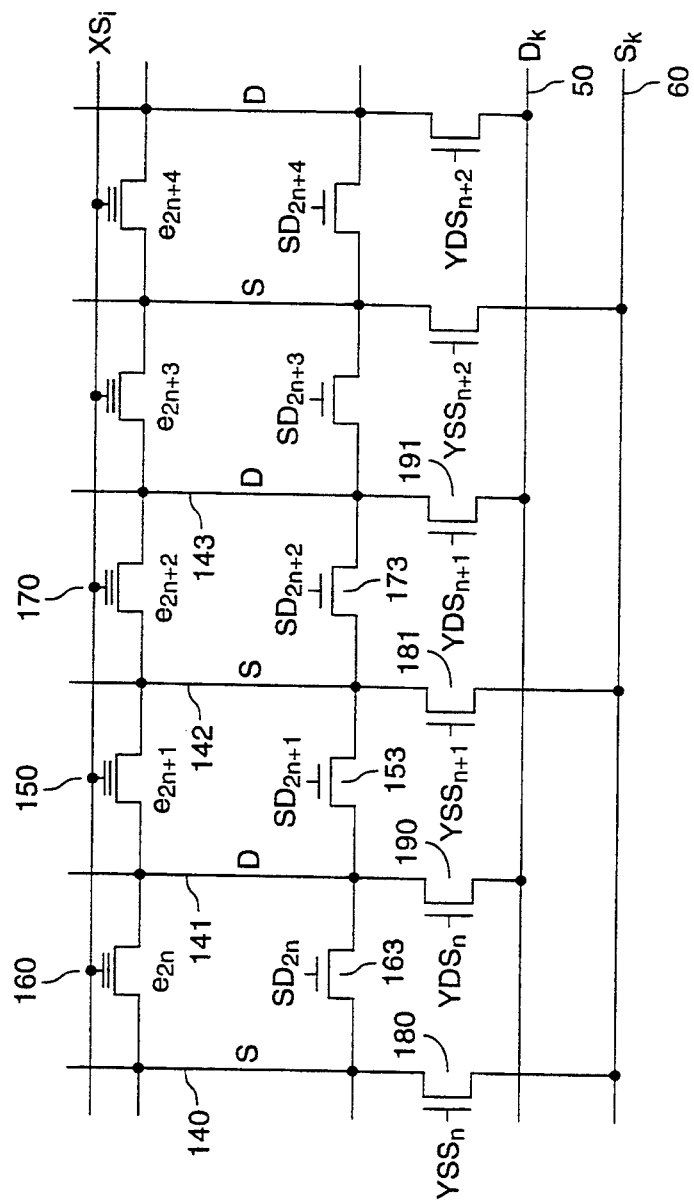
FIG. 6 illustrates a second particular embodiment implementing the biasing scheme of FIG. 4.

A circuit implementing the biasing scheme of FIG. 4 in a different manner is shown in FIG. 6. In this circuit each memory transistor 150, 160, 170, etc. has a shorting device 153, 163, 173, respectively, placed across its columns. Each column also has a line coupling transistor to couple it to either $S_k$ or $D_k$, alternating from column to column, i.e., transistors 180 and 181 can couple columns 140 and 142 to $S_k$, while transistors 190 and 191 can couple columns 141 and 143 to $D_k$. In this circuit, only the columns of the selected memory transistor are coupled to $D_k$ and $S_k$; however, the other columns are coupled through the shorting devices to their neighbor columns. If transistor 150 were to be selected for programming, transistors 181 and 190 would connect columns 142 and 141 to $S_k$ and $D_k$, respectively. The other line coupling transistors, 180, 191, etc., would remain off. The other columns would still be tied to either $S_k$ or $D_k$, however, through the shorting devices. Shorting device 153 would remain off, but all the others would be turned on. This would couple all the columns on the drain side of transistor 150 to $D_k$ through transistor 181, and all the columns on the source side of transistor 150 to $S_k$ through transistor 190. The shorting transistors preferably are configured such that they turn on slightly quicker than the memory transistors, but even if they turn on at the same time, the shorting devices will at least reduce any current that might flow through a non-selected memory transistor.

Many structural and operational variations of the circuit of FIG. 6 are possible. For instance, the columns of the selected memory transistor need not be the only columns coupled to $D_k$ and $S_k$. All source coupling transistors to the source side of the selected memory transistor could be turned on, and all drain coupling transistors to the drain side of the selected memory transistor could be turned on as well. These would provide paths to the source and drain voltage lines redundant to the shorting devices, or they could allow fewer shorting devices to be employed. Circuits combining these techniques with the technique of FIG. 5 could also be employed.

Figure 1:
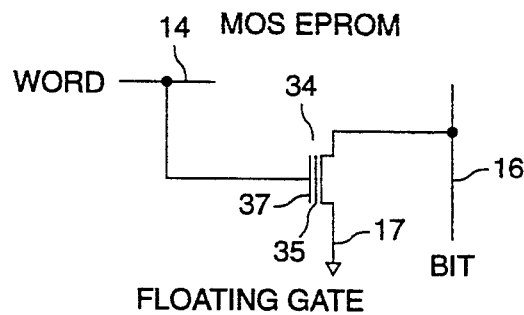
FIG. 1 is an illustration of a prior art MOS memory cell.
Figure 2A:
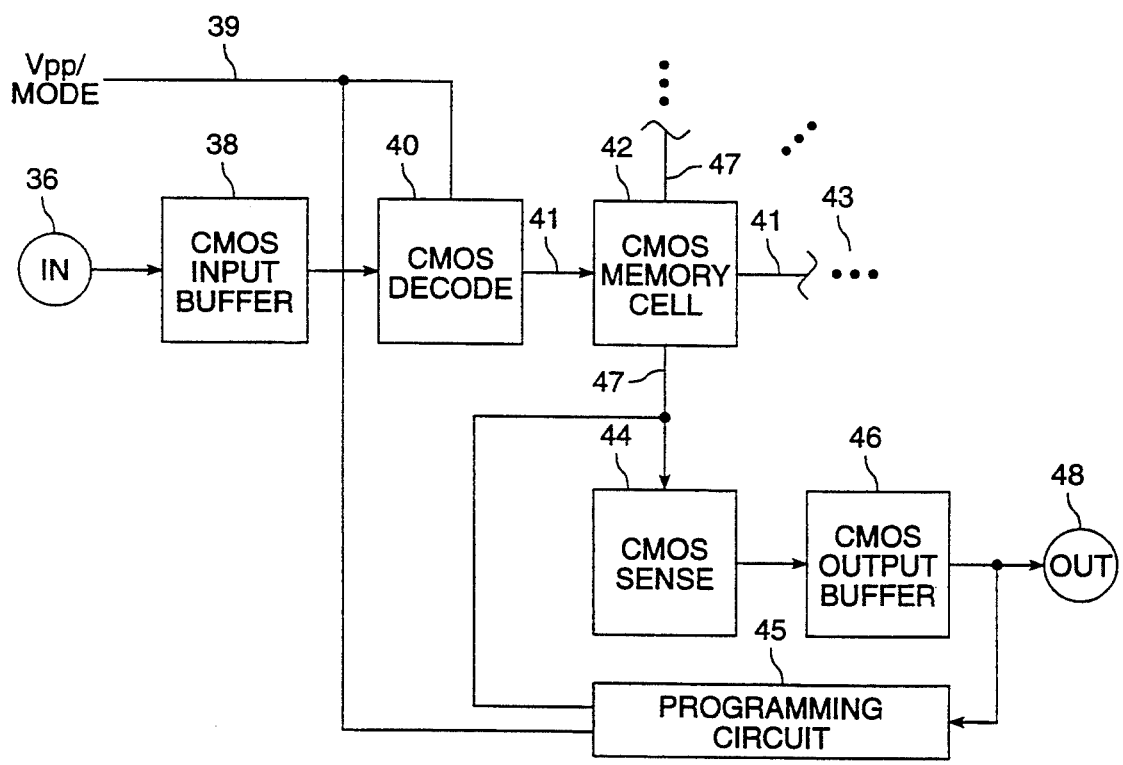
FIG. 2A is a generalized illustration of a prior art MOS EPROM circuit.
Figure 2B:
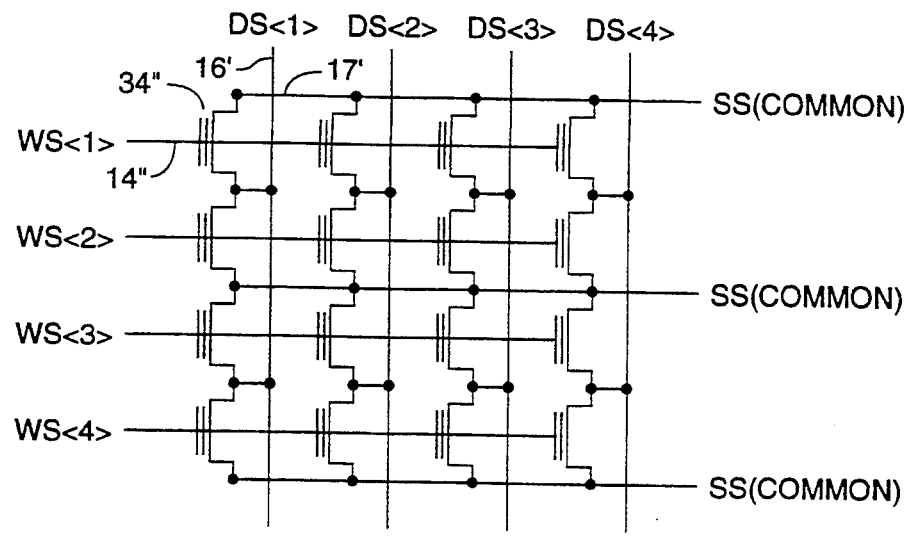
FIGS. 2B and 2C are diagrams illustrating alternative configurations for prior art EPROM circuits.
Figure 2C:
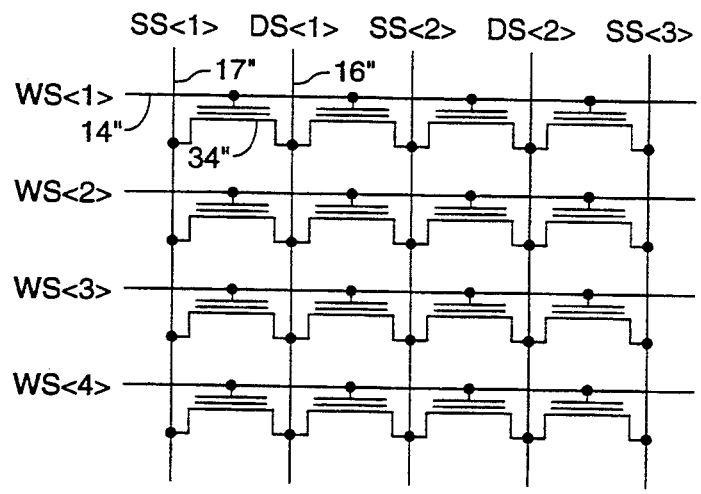
Figure 3:
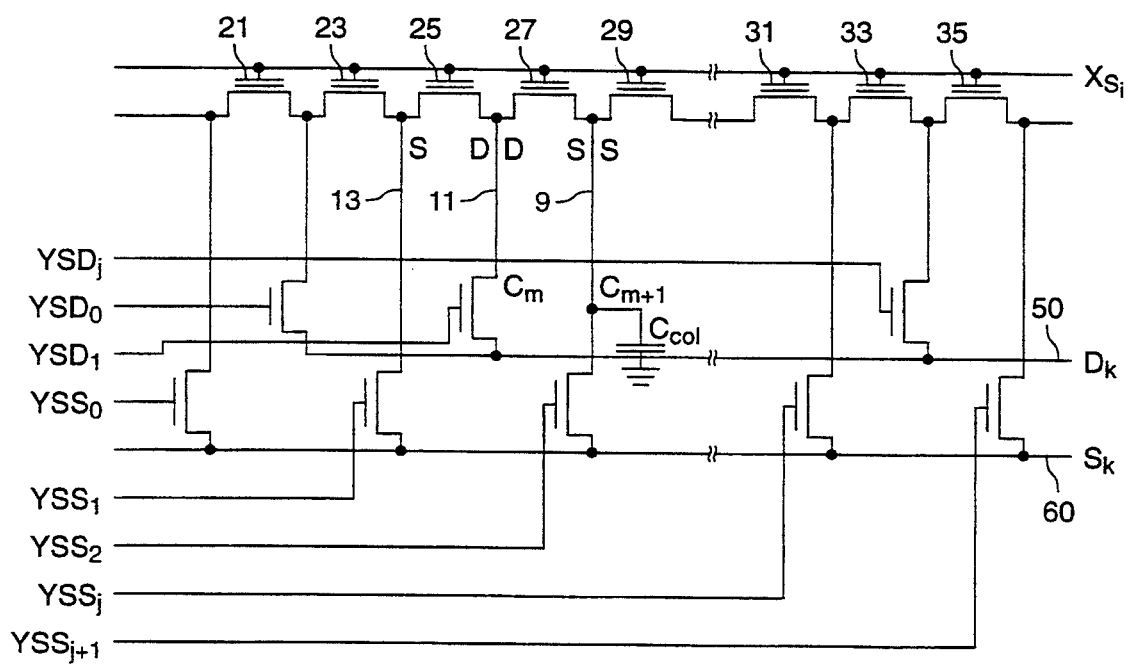
FIG. 3 is an illustration of a prior art MOS EPROM memory cell array circuit.

The circuits of FIGS. 5 and 6 are both possible solutions to the disturb problem in a shared column MOS memory array. However, these solutions are not without drawbacks. The circuit of FIG. 3 requires only n+1 column select lines for n bits per block, but for the same number of bits per block the circuit of FIG. 5 requires 2n column select lines, and the circuit of FIG. 6, 2n+1. In implementations where the column selector is metal pitch limited, increasing the number of column selects increases the total chip area, which is undesirable.

Figure 7:
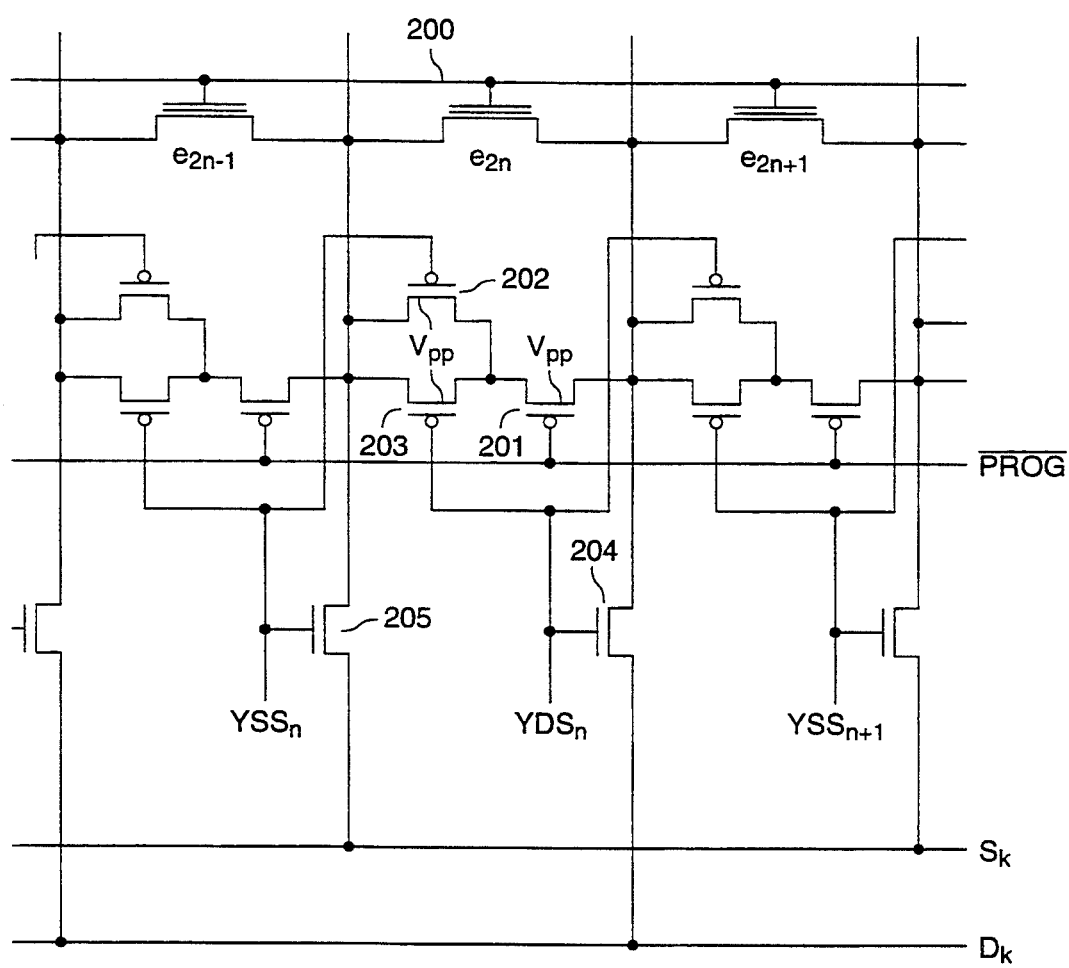
FIG. 7 illustrates a third embodiment that requires few column select lines.

FIG. 7 illustrates a shared column CMOS array with a column selector circuit that prevents write disturb while minimizing the number of column select lines. This circuit employs a shorting device as did the circuit of FIG. 6, and again the columns alternate source, drain, source, etc. The column selector circuit for each stage 200 of FIG. 7 has a shorting device composed of three PMOS transistors 201, 202, and 203. These transistors have their wells biased at a level at least as high as the highest voltage that might occur on the columns when the shorting device is to be enabled, to keep them properly reverse biased. In the preferred embodiment these transistors all have their wells connected to $V_{pp}$. Transistor 201 is controlled by an inverted program signal ($\overline{prog}$) on a control line so that the shorting device is disabled during read operations. Transistor 201 is not strictly necessary and could be removed from the circuit, although read operations would be slowed if all the columns were shorted together during reads. Transistors 202 and 203 are connected in parallel and are together in series with transistor 201. Transistor 202 is controlled by the left side column select signal, and transistor 203 is controlled by the right side column select signal. The column select signals also control, of course, column select transistors 204 and 205, which are NMOS transistors. A stage's shorting device is thus enabled during all write operations unless both columns of that stage are selected. This circuit meets all the described design goals: write disturb is prevented, and only n+1 column select lines (including $\overline{prog}$) are required for a block of n bits.

Figure 8:
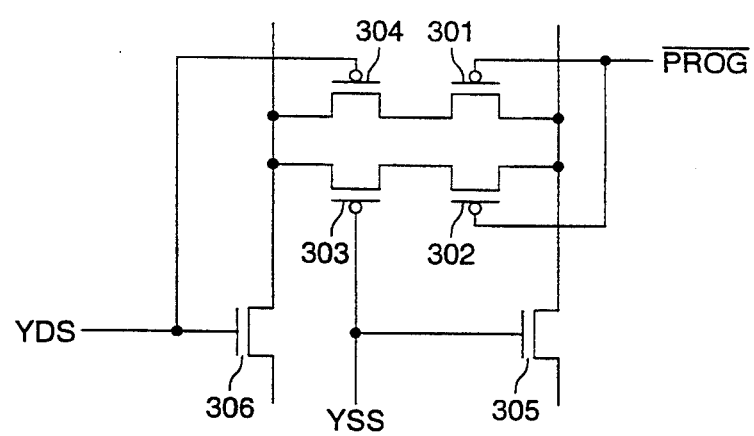
FIG. 8 illustrates the column selector circuit of FIG. 7, modified slightly for ease of layout.

To simplify layout, a fourth PMOS transistor may be added to the column selector circuit of FIG. 7. As shown in FIG. 8, the shorting device now consists of PMOS transistors 301 and 302 controlled by $\overline{prog}$, and PMOS transistors 303 and 304 controlled by the source and drain column selector lines, respectively. The shorting device now has two parallel paths; one formed by transistors 301 and 303 in series, and the other formed by transistors 302 and 204 in series. As in FIG. 7, the source and drain select lines control transistors 305 and 306, respectively. Due to its highly parallel formation, this column selector circuit has the added advantage that for narrow pitch arrays the source and drain selectors may be placed on opposite sides of the array.

Figure 9:
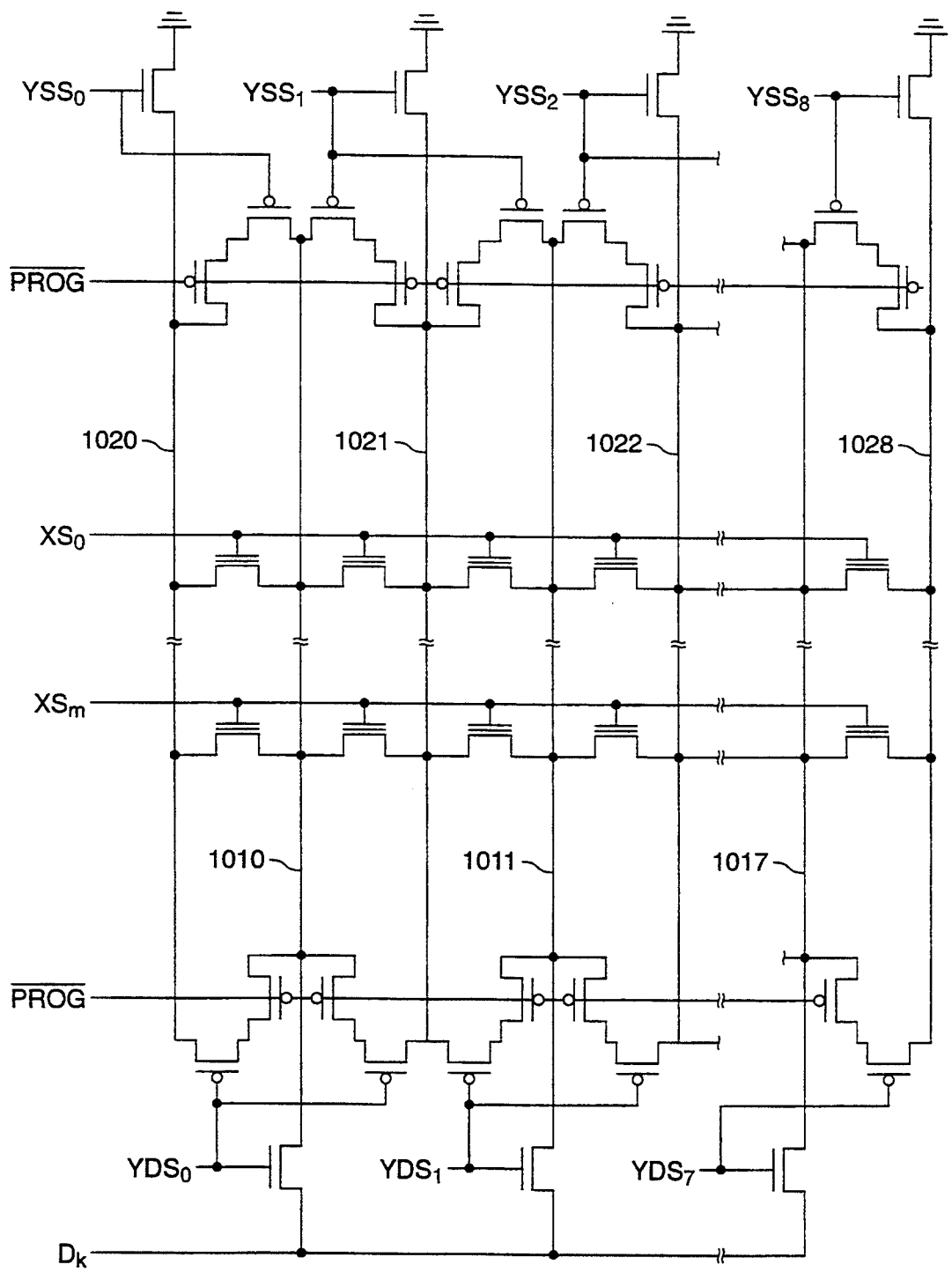
FIG. 9 illustrates a narrow pitch shared column memory cell array employing the column selector of FIG. 8.

Such an arrangement is employed in the shared column memory cell array shown in FIG. 9. This array includes sixteen column stages, requiring eight drain columns 1010 to 1017 and nine source columns 1020 to 1028. For all stages, the source line control transistors and the shorting device path controlled by the source select lines are at one end of the array, and the drain line control transistors and the shorting device path controlled by the drain select lines are at the other end of the array. In between is the array of word lines and memory transistors. In this embodiment, rather than having a separate $S_k$ line, the source columns are connected directly to ground. With this arrangement, very narrow column stages may be constructed, for the modest "price" of one extra $\overline{prog}$ line compared to the circuit of FIG. 7, for a total of nineteen (n+3) wires, including column select lines, that are required for sixteen bits per block.

It is understood that the above description is intended to be illustrative only and not restrictive. Many variations of the invention will become apparent to those of skill in the art upon review of this disclosure. The scope of the invention should, therefore, be determined not with reference to the above description, but instead should be determined with reference to the appended claims along with their full scope of equivalents.

What is claimed is:

1. A shared column EPROM memory comprising
   a) a program control line;
   b) a plurality of memory transistors sharing a word line, said memory transistors having sources and drains coupled to column lines;
   c) means for selecting one of said memory transistors for programming, wherein said memory transistor has a source coupled to a first column line and a drain coupled to a second column line, said selecting means comprising a first column transistor coupling said first column line to a source programming voltage and a second column transistor coupling said second column line to a drain programming voltage, said first and second column transistors controlled by first and second column selection lines, respectively;
   d) column coupling means
      i) for coupling a first group of said column lines, on a same side of said selected memory transistor as said selected memory transistor source, to said source programming voltage, and
      ii) for coupling a second group of said column lines, on a same side of said selected memory transistor as said selected memory transistor drain, to said drain programming voltage,
      said coupling means comprising shorting devices between adjacent column lines for connecting said adjacent column lines when said shorting devices are enabled, and means, responsive to said selection means, for enabling a plurality of said shorting devices other than a shorting device connecting said first and second column lines, and wherein
   e) each said shorting device comprises
      i) a first shorting transistor controlled by said first column selection line,
      ii) a second shorting transistor controlled by said second column selection line, and
      iii) a third shorting transistor controlled by said program control line.

2. The EPROM memory of claim 1, wherein said first and second column transistors are NMOS transistors, and wherein said first, second, and third shorting transistors are all PMOS transistors.

3. The EPROM memory of claim 2, wherein said first and second shorting transistors are in parallel with each other and in series with said third shorting transistor, said first, second and third shorting transistors together coupling said first column line to said second column line.

4. The EPROM memory of claim 2, further comprising a fourth shorting PMOS transistor controlled by said program control line, said first shorting transistor being in series with said third shorting transistor, said second shorting transistor being in series with said fourth shorting transistor, said first and third shorting transistors together coupling said first column line to said second column line, and said second and fourth shorting transistors together coupling said first column line to said second column line.

* * * * *